United States Patent [19]
Chang

[11] Patent Number: 6,103,575
[45] Date of Patent: Aug. 15, 2000

[54] METHOD OF FORMING A SINGLE POLY CYLINDRICAL FLASH MEMORY CELL HAVING HIGH COUPLING RATIO

[75] Inventor: Ko-Hsing Chang, Taipei, Taiwan

[73] Assignee: Worldwide Semiconductor Manufacturing Corporation, Hsinchu, Taiwan

[21] Appl. No.: 09/378,044

[22] Filed: Aug. 20, 1999

Related U.S. Application Data

[62] Division of application No. 09/050,622, Mar. 30, 1998, Pat. No. 5,973,354.

[51] Int. Cl.$^7$ .................................................. H01L 21/336
[52] U.S. Cl. ............................ 438/257; 438/226; 438/283
[58] Field of Search .................................. 438/211, 257, 438/259, 262, 266, 283

[56] References Cited

U.S. PATENT DOCUMENTS

| | | | |
|---|---|---|---|
| 5,235,544 | 8/1993 | Caywood | 365/185 |
| 5,502,321 | 3/1996 | Matsushita | 257/316 |
| 5,633,513 | 5/1997 | Yamazaki et al. | 257/315 |
| 5,780,893 | 7/1998 | Sugaya | 257/318 |
| 5,792,670 | 8/1998 | Pio et al. | 438/257 |
| 5,981,342 | 11/1999 | Kakoschke et al. | 438/266 |

*Primary Examiner*—Wael Fahmy
*Assistant Examiner*—Kurt Eaton
*Attorney, Agent, or Firm*—Blakely, Sokoloff, Taylor & Zafman LLP

[57] ABSTRACT

A flash memory cell formed in a semiconductor substrate. The memory cell comprises: (a) a gate oxide formed atop said semiconductor substrate, said gate oxide including a thin region and a thick region; (b) a floating gate formed atop said thin region; (c) a control gate formed atop said thick region; (d) a drain region formed under said thin region and within said floating gate; (e) a source region formed under said thick region and outside said control gate; and (f) an insulating dielectric layer between said control gate and said floating gate.

5 Claims, 3 Drawing Sheets

METHOD OF FORMING A SINGLE POLY CYLINDRICAL FLASH MEMORY CELL HAVING HIGH COUPLING RATIO

RELATED APPLICATIONS

This application is a divisional of U.S. patent application Ser. No. 09/050,622, U.S. Pat. No. 5,973,354 filed Mar. 30, 1998, priority from the filing date of which is hereby claimed under 35 U.S.C. § 120.

FIELD OF THE INVENTION

This invention relates to semiconductor flash memory, and more particularly, to a flash memory cell using a single poly process.

BACKGROUND OF THE INVENTION

Flash memory is classified as non-volatile memory because a memory cell in the flash memory can retain the data stored in the memory cell without periodic refreshing. Most prior art flash memory can store a single bit in a memory cell. In other words, the memory cell can either store a "one" or a "zero".

Further, typical prior art flash memory cells are "two poly" processes, i.e., two distinct polysilicon deposition steps are required to form the cell. The most common structure for a flash memory cell is shown in FIG. 1. Further, typical prior art flash memory cells are "two poly" processes, i.e., two distinct polysilicon deposition steps are required to form the cell. In the most common structure for a flash memory cell shown in FIG. 1, a floating gate 101 comprised of polysilicon is formed atop of a thin gate oxide layer 103. A composite dielectric layer 111, such as oxide-nitride-oxide, is located atop the floating gate 101. The floating gate 101 and the composite dielectric layer 111 are in turn deposited and simultaneously patterned atop a semiconductor substrate 105. Finally, a control gate 113 comprised of polysilicon is formed atop the insulating oxide layer 111 and atop the floating gate 101. Adjacent the floating gate 101 are implanted source 107 and drain 109 regions.

In operation, the floating gate 101 can be in one of two states: (1) storing charge or (2) not storing charge. When the floating gate 101 is storing charge, the threshold voltage of the transistor will be shifted in the positive direction and a predetermined applied voltage applied to control gate 113 will not cause current to flow from the source 107 to the drain 109. When the floating gate 101 is not storing charge, the threshold voltage of the transistor will be shifted in the negative direction and the predetermined applied voltage applied to the control gate 113 will cause current to flow from the source 107 to the drain 109. In this manner, by using a "select transistor" (not shown) to measure the current from the source 107 to the drain 109 when a predetermined applied voltage is applied to the control gate 113, a determination can be made as to whether or not the floating gate 101 is carrying a charge, i.e., whether a "one" or a "zero" is being stored in the flash memory cell.

The process of placing a charge into the floating gate 101 ("writing") or removing a charge from the floating gate 101 ("erasing") is well known in the art and is simply the appropriate combination of applying voltages to the control gate 113, the source 107, and the drain 109. Further details of the flash memory cell of FIG. 1 may be found in Prince, "Semiconductor Memories: A Handbook of Design, Manufacture, and Application, 2nd Ed.," J. Wiley, 1991.

As seen in FIG. 1, the floating gate 101 requires the deposition of a first polysilicon layer and the control gate 113 requires the deposition of a second polysilicon layer. Additionally, the gate coupling ratio of the flash memory cell of FIG. 1 is relatively low. What is needed is a flash memory cell that may be manufactured using a single polysilicon layer and that provides a high coupling ratio.

SUMMARY OF THE INVENTION

A flash memory cell that can be manufactured with a single polysilicon deposition step is disclosed. By using a single polysilicon deposition step, the flash memory cell may be more easily embedded into CMOS logic circuits.

A flash memory cell formed in a semiconductor substrate is disclosed. The memory cell comprises: (a) a gate oxide formed atop said semiconductor substrate, said gate oxide including a thin region and a thick region; (b) a floating gate formed atop said thin region; (c) a control gate formed atop said thick region; (d) a drain region formed under said thin region and within said floating gate; (e) a source region formed under said thick region and outside said control gate; and (f) an insulating dielectric layer between said control gate and said floating gate.

In accordance with other aspects of the present invention, a method of manufacturing a single-poly flash memory cell on a semiconductor substrate is disclosed. The method comprises the steps of: (a) forming a gate oxide layer on said semiconductor surface, said gate oxide layer having at least a thin portion and at least a thick portion; (b) forming a polysilicon layer atop said gate oxide layer; (c) patterning and etching said polysilicon layer to produce a floating gate and a control gate, said floating gate located atop said thin portion of said gate oxide layer, said control gate being atop said thick portion of said gate oxide layer; (d) forming dielectric regions between said control gate and said floating gate; (e) forming dielectric sidewall spacers on the sidewalls of said control gate and said floating gate; and (f) ion implanting dopants into said semiconductor substrate using said dielectric regions, sidewall spacers, floating gate, and control gate as a mask to form source and drain regions.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1:
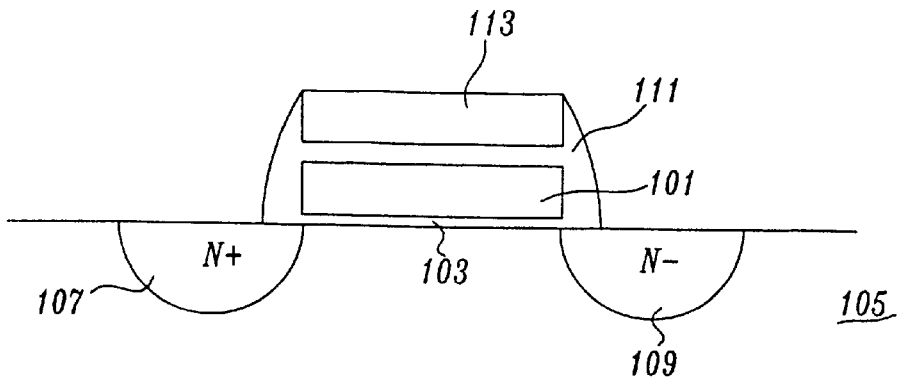
FIG. 1 is a cross-sectional view of a semiconductor substrate illustrating a prior art flash memory cell.
Figure 2:
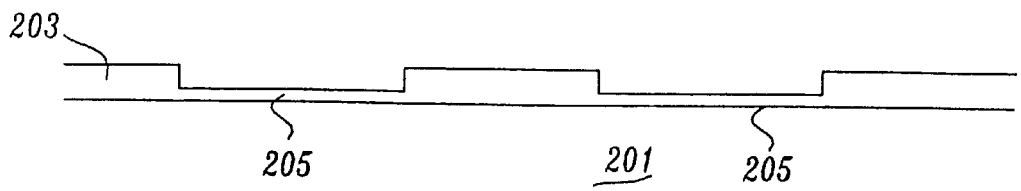
FIGS. 2–5 are cross-sectional views of a semiconductor substrate illustrating the steps in manufacturing a flash memory cell in accordance with the present invention.

Turning to FIG. 2, a p-type silicon substrate 201 is provided. A gate oxide layer 203 is formed on the silicon substrate 201. Preferably, the gate oxide layer 203 is formed from silicon dioxide and has a thickness of 250 angstroms. One conventional method of forming the gate oxide layer 203 is to oxidize the silicon substrate 201 in an oxygen ambient. The gate oxide layer 203 is then patterned and etched using conventional photolithography techniques to form portions of the gate oxide layer 203 that are thinner than the original thickness of the gate oxide layer 203. These are referred to as thin regions 205. Preferably, the thin regions 205 of the gate oxide layer 203 have a thickness of 100 angstroms.

Figure 3:
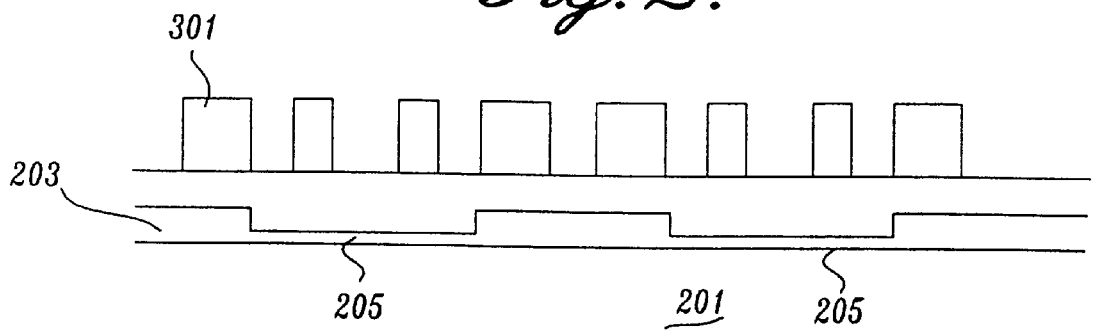

Next, turning to FIG. 3, a polysilicon layer 301 is deposited onto the gate oxide layer 203. Preferably, the polysilicon layer 301 has a thickness on the order of 1500 angstroms. Next, a photoresist layer 303 is deposited onto the polysilicon layer 301. The photoresist layer 303 is then exposed and developed to provide the masking pattern shown in FIG. 3.

Figure 4:
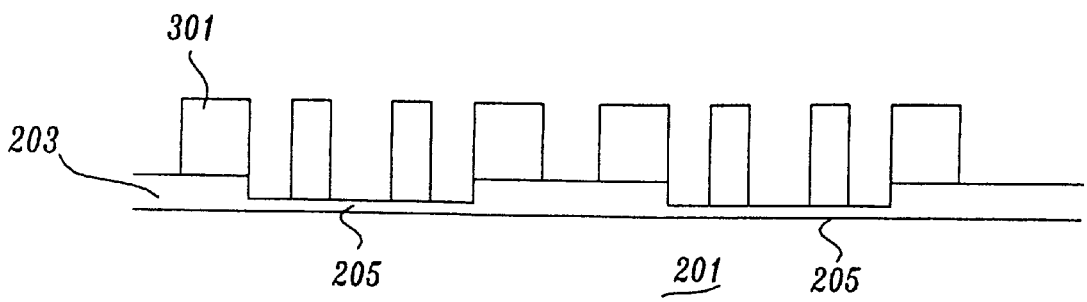

Next, turning to FIG. 4, an anisotropic etching step, such as a reactive ion etching, is performed to etch the polysilicon layer 301 using the photoresist as a mask until the gate oxide layer 203 is reached. The resultant structure is shown in FIG. 4. Note that in the top and perspective views shown in FIGS. 6 and 7, the photoresist layer 303 provides a mask that etches the polysilicon layer 303 into cylindrical shapes. The inner cylinder (referred to as the floating gate 701 seen in FIG. 7) is wholly formed within the thin portions 205 of the gate oxide layer 203. The outer cylinder (referred to as the control gate 703 seen in FIG. 7) is wholly formed within the thick portions of the gate oxide layer 203 and preferably abuts against the edge of the thin portions of the gate oxide layer 203. It is important that the control gate 703 be formed over the thick portions of the gate oxide layer 203. As will be seen below, the control gate 703 will have a high bias voltage placed thereon and the thick gate oxide layer 203 will provide the necessary isolation.

Although in the preferred embodiment, the floating gate 701 and the control gate 703 structures are cylindrical, they may be of any shape including but not limited to oval, elliptical, triangular, square, or other polygonal shape. It is further preferred that the shape of the floating gate and the control gate be a closed figure. The term "closed figure" is meant to include all circles, ellipses, ovals and polygons.

Further, preferably the spacing between the floating gate 701 and the control gate 703 are on the order of 0.1 to 0.15 microns. This relatively narrow spacing may be done using a mask shifting or e-beam technique to expose the photoresist layer 303.

Figure 5:
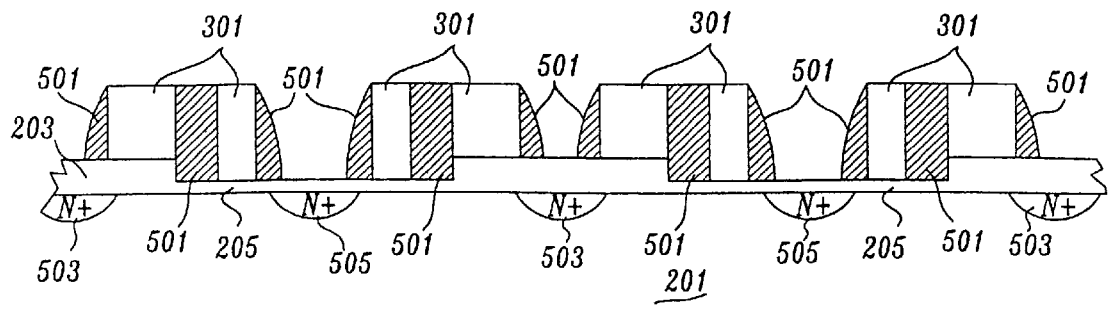

Next, turning to FIG. 5, a dielectric layer 501 is deposited over the polysilicon layer 301. Preferably, the dielectric layer 501 is comprised of silicon dioxide and nitride. It can be appreciated that any conventional insulating dielectric material may be used. Next, openings are made in the dielectric layer 501 to expose source and drain regions. In the preferred embodiment, an etch back step is performed and sidewall spacers on the inner surface of the inner cylinders are formed. In addition, sidewall spacers on the outside of the outer cylinders are formed. The etch back method of forming openings is advantageous for its relative ease of implementation without the need for a mask.

However, it can be appreciated that other methods of forming the openings are possible. For example, a patterning and etching technique may be used to manufacture the openings. This approach would likely provide higher quality isolation, but at the expense of an additional masking step. Yet another method of forming the dielectric layer is to thermally oxidize the exposed polysilicon layer to produce silicon dioxide conformally on the exposed polysilicon surfaces.

Finally, ion implantation is used to form the source 503 and drain 505 regions in the silicon substrate 201. During later processing involving high temperatures, the source and drain regions will laterally diffuse. The resultant structure is shown in FIGS. 5–7.

Figure 6:
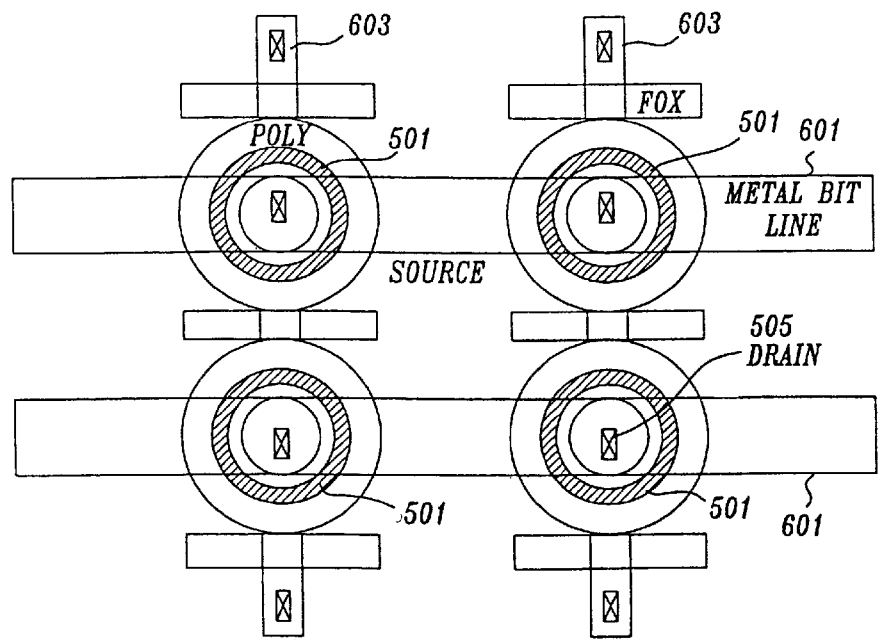
FIG. 6 is a top view of a portion of a flash memory cell array formed in accordance with the present invention.

FIG. 6 is a top perspective view of a portion of a flash memory array using the flash memory cells disclosed herein. In this case, FIG. 6 shows a 2×2 array. As is conventional in all flash memory arrays, the drains associated with each flash memory cell in a row of the array are connected by a "bit line." In this preferred embodiment, the bit line 601 is formed from a metal. Further, a word line 603 joins each of the control gates of each flash memory cell in a column.

Figure 7:
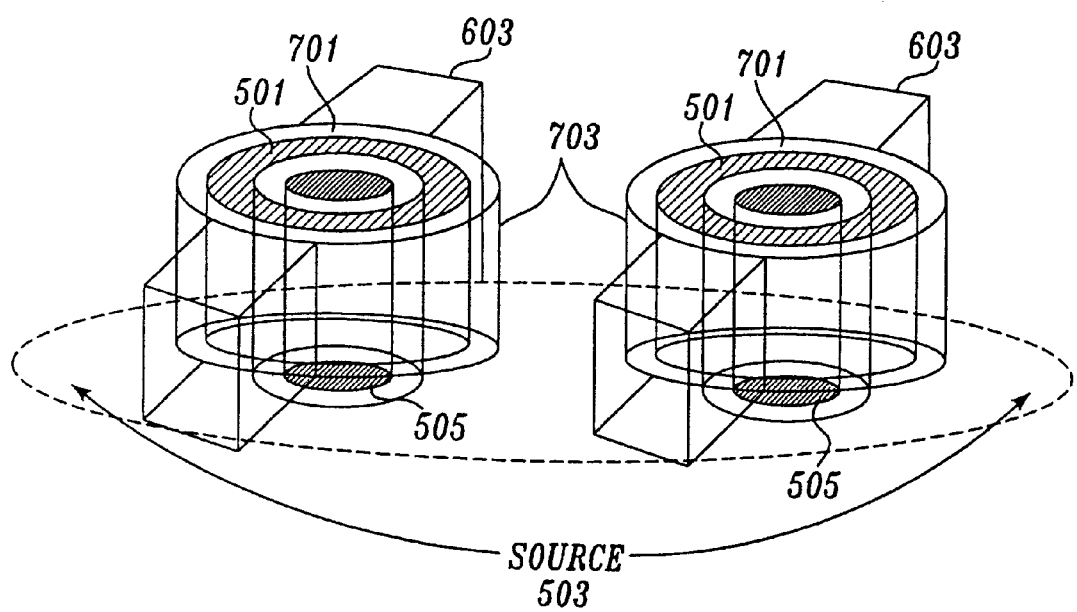
FIG. 7 is an isometric view of a portion of a flash memory cell array formed in accordance with the present invention.

FIG. 7 is an isometric view of two flash memory cells in a common row. As can be seen, the control gate 703 is of circular shape and surrounds the circular floating gate 701.

The operation of the flash memory cell of the present invention is as follows: During the write (also referred to as programming) operation, the drain 505 is biased to 5 volts, the source 503 is grounded, and the control gate 703 is biased at 10 volts. The floating gate 701 is programmed via hot electron injection.

During the erase operation, the drain 505 is biased to 5 volts, while the control gate 703 is biased to −10 volts. The result is that through the Fowler-Nordheim effect, the floating gate 701 is erased.

During the read operation, the control gate 703 and the drain 505 are biased to 5 volts and the source is grounded. The current flowing from source to drain is then measured to provide an indication as to the state of the floating gate 701.

One important advantage of the present invention is that because a cylindrical shape is used, a high coupling ratio is achieved between the control gate 703 and the floating gate 701. This high coupling ratio allows for faster reading, writing, and erasing of the flash memory cell.

While the preferred embodiment of the invention has been illustrated and described, it will be appreciated that various changes can be made therein without departing from the spirit and scope of the invention.

What is claimed is:

1. A method of manufacturing a single-poly flash memory cell on a semiconductor substrate, said method comprising the steps of:
   (a) forming a gate oxide layer on said semiconductor substrate, said gate oxide layer having at least a thin portion and at least a thick portion;
   (b) forming a polysilicon layer atop said gate oxide layer;
   (c) patterning and etching said polysilicon layer to produce a floating gate and a control gate, said floating gate located atop said thin portion of said gate oxide layer, said control gate being atop said control gate being atop said thick portion of said gate oxide layer;
   (d) forming dielectric regions between said control gate and said floating gate;
   (e) forming dielectric sidewall spacers of said control gate and said floating gate; and
   (f) ion implanting dopants into said semiconductor substrate using said dielectric regions, sidewall spacers, floating gate, and control gate as a mask to form source and drain regions.

2. The method of claim 1 wherein said step of forming said dielectric regions and said sidewall spacers includes the step of depositing an inter-layer dielectric layer and etching back said inter-layer dielectric layer.

3. The method of claim 1 wherein said floating gate is wholly atop said thin portion and said control gate is wholly atop said thick portion.

4. A method of manufacturing a single-poly flash memory cell on a semiconductor substrate, said method comprising the steps of:

(a) forming a gate oxide layer on said semiconductor substrate, said gate oxide layer having at least a thin portion and at least a thick portion;

(b) forming a polysilicon layer atop said gate oxide layer;

(c) patterning and etching said polysilicon layer to produce a floating gate and a control gate, said floating gate located atop said thin portion of said gate oxide layer, said control gate being atop said thick portion of said gate oxide layer;

(d) depositing an insulating layer over said polysilicon layer and said gate oxide layer;

(e) etching back said insulating layer to form insulating regions between said control gate and said floating gate and sidewall spacers on the sidewalls of said control gate and said floating gate; and (f) ion implanting dopants into said semiconductor substrate using said dielectric regions, sidewall spacers, floating gate, and control gate as a mask to form source and drain regions.

5. The method of claim 4 wherein said floating gate is wholly atop said thin portion and said control gate is wholly atop said thick portion.

* * * * *